United States Patent
Kishimoto

(10) Patent No.: US 9,184,566 B2
(45) Date of Patent: Nov. 10, 2015

(54) METHOD FOR MANUFACTURING SEMICONDUCTOR LASER ELEMENT

(71) Applicant: Mitsubishi Electric Corporation, Tokyo (JP)

(72) Inventor: Kazumasa Kishimoto, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 14/530,873

(22) Filed: Nov. 3, 2014

(65) Prior Publication Data

US 2015/0180198 A1 Jun. 25, 2015

(30) Foreign Application Priority Data

Dec. 24, 2013 (JP) .................. 2013-265621

(51) Int. Cl.
*H01L 21/28* (2006.01)
*H01S 5/227* (2006.01)
*H01S 5/02* (2006.01)
*H01S 5/22* (2006.01)
*H01S 5/20* (2006.01)

(52) U.S. Cl.
CPC ............ *H01S 5/2275* (2013.01); *H01S 5/0207* (2013.01); *H01S 5/209* (2013.01); *H01S 5/2086* (2013.01); *H01S 5/2222* (2013.01)

(58) Field of Classification Search
CPC ..... H01S 5/0207; H01S 5/2086; H01S 5/209; H01S 5/2222; H01S 5/2275
USPC .................................................. 438/602–609
See application file for complete search history.

(56) References Cited

U.S. PATENT DOCUMENTS

2001/0043632 A1* 11/2001 Ohya et al. ...................... 372/45

FOREIGN PATENT DOCUMENTS

| JP | 62-214622 A | 9/1987 |
| JP | 64-73726 A | 3/1989 |

* cited by examiner

*Primary Examiner* — H Tsai
(74) *Attorney, Agent, or Firm* — Leydig, Voit & Mayer, Ltd.

(57) ABSTRACT

A method for manufacturing a semiconductor laser element includes forming an etching end point detection layer on part of a substrate, forming an substrate exposed portion and forming a lower cladding layer, an active layer, and an upper cladding layer on the etching end point detection layer and on the exposed portion, forming an insulating film pattern at a distance corresponding to a clearance region, from directly above a boundary between the substrate exposed portion and the etching end point detection layer, etching the upper clad layer, the active layer, and the lower cladding layer using the insulating film pattern as a mask and stopping etching at a time when the etching end point detection layer is exposed or after a predetermined time duration after the time.

8 Claims, 8 Drawing Sheets

METHOD FOR MANUFACTURING SEMICONDUCTOR LASER ELEMENT

BACKGROUND OF THE INVENTION

1. Field of the Invention

The present invention relates to a method for manufacturing a semiconductor laser element used for optical communication, for example.

2. Background Art

Japanese Patent Application Laid-Open No. 64-73726 discloses a technique for detecting an etching end point through an etching end point detection layer formed beforehand when etching an object to be processed.

In dry etching, ridge etching that forms a ridge of a semiconductor laser element involves a problem that a stable etching depth cannot be achieved due to a variation in capability of an etching apparatus. When a ridge height is not stable, a problem may occur that a leak path is formed in a current block layer in which the ridge is embedded.

An etching end point detection layer may be used to make an etching depth stable. However, since the method described in Japanese Patent Application Laid-Open No.64-73726 forms an etching end point detection layer on the entire surface of a substrate, the etching end point detection layer exists in the current path of the semiconductor laser element. In this case, carriers may be trapped at a level of the etching end point detection layer, resulting in a problem of adversely affecting characteristics of the semiconductor laser element.

SUMMARY OF THE INVENTION

The present invention has been implemented to solve the above-described problem, and it is an object of the present invention to provide a method for manufacturing a semiconductor laser element enabling stable ridge etching without adversely affecting characteristics of the semiconductor laser element.

The features and advantages of the present invention may be summarized as follows.

According to one aspect of the present invention, a method for manufacturing a semiconductor laser element includes a detection layer formation step of forming an etching end point detection layer on part of a substrate using a material different from that of the substrate, a step of forming an exposed portion which is an exposed portion of the substrate and a lower clad layer, an active layer and an upper clad layer on the etching end point detection layer, a step of forming an insulating film pattern at a distance corresponding to a clearance region from directly above a boundary between the exposed portion and the etching end point detection layer on the upper clad layer formed on the exposed portion, an etching step of etching the upper clad layer, the active layer and the lower clad layer using the insulating film pattern as a mask and stopping etching at a point in time at which the etching end point detection layer is exposed from the surface or after a lapse of a predetermined time from the point in time, and an embedding step of embedding a ridge formed below the insulating film pattern in the etching step in a current block layer.

Other and further objects, features and advantages of the invention will appear more fully from the following description.

DETAILED DESCRIPTION OF THE PREFERRED EMBODIMENTS

Figure 1:
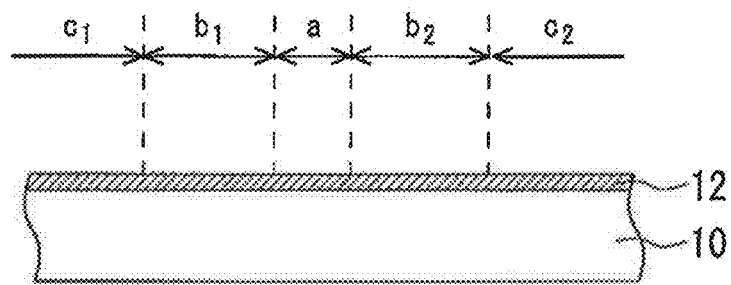
FIG. 1 shows an insulating film.

A method for manufacturing a semiconductor laser element according to an embodiment of the present invention will be described with reference to the accompanying drawings. The same or corresponding components will be assigned to the same reference numerals and duplicate descriptions may be omitted.

First Embodiment.

FIGS. 1 to 10 illustrate a method for manufacturing a semiconductor laser element according to a first embodiment of the present invention. First, as shown in FIG. 1 which is a cross-sectional view, an insulating film 12 is formed on the entire surface of a substrate 10. The material of the substrate 10 is, for example, p-type InP. The substrate 10 is provided with a ridge formation region a in which a ridge is formed, clearance regions b1 and b2 to the left and right of the ridge formation region a, and outside regions c1 and c2 to the left and right of the ridge formation region a and the clearance regions b1 and b2. The insulating film 12 is $SiO_2$ having a film thickness of 400 nm formed using, for example, a plasma-CVD method.

Figure 2:
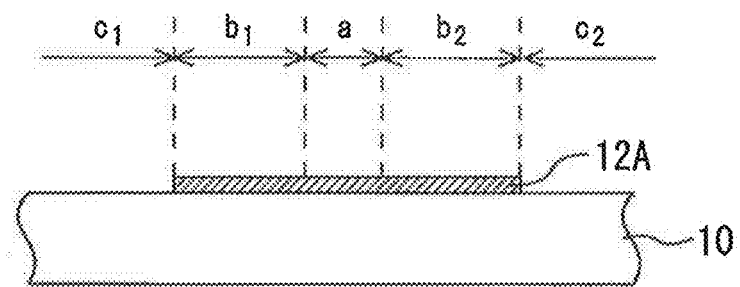
FIG. 2 shows the insulating film.

Next, as shown in FIG. 2 which is a cross-sectional view, part of the insulating film 12 is removed by etching In this step, the insulating film 12 of the outside regions c1 and c2 is removed through RIE (Reactive Ion Etching) using, for example, a $CF_4/O_2$ mixed gas while leaving an insulating film 12A of the ridge formation region a and the clearance regions b1 and b2.

Figure 3:
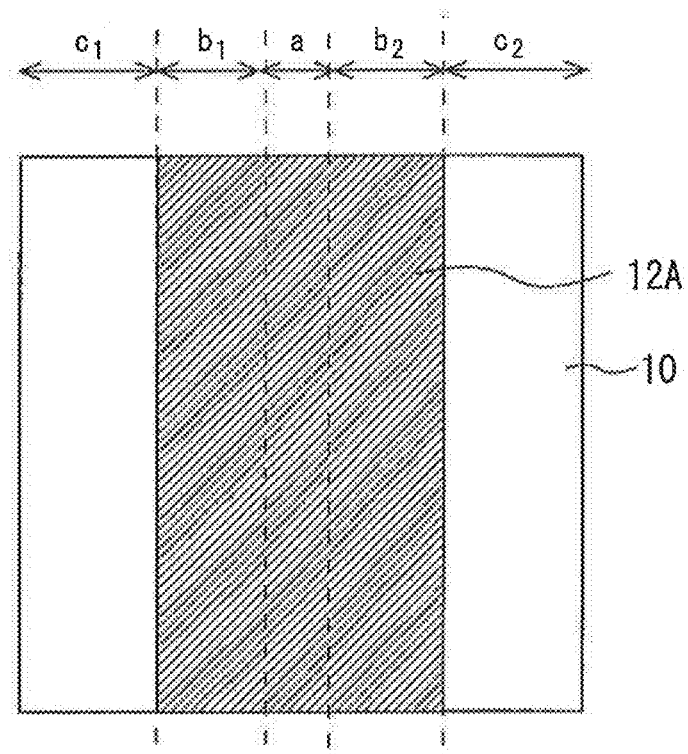
FIG. 3 is a plan view of one chip in a wafer.

FIG. 3 is a plan view of FIG. 2. FIG. 3 illustrates one chip in a wafer. The insulating film 12A is formed in a stripe shape in the ridge formation region a and the clearance region b. The width of the clearance region b is 1 μm.

Figure 4:
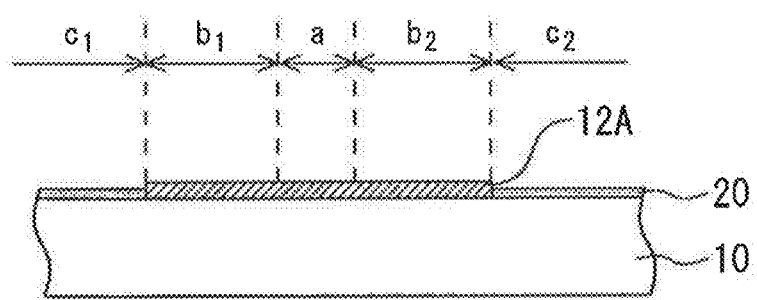
FIG. 4 shows an etching end point detection layer.

Next, as shown in FIG. 4 which is a cross-sectional view, an etching end point detection layer 20 is formed. The etching end point detection layer 20 epitaxially grows in the outside regions c1 and c2 which are regions from which the insulating film 12 has been removed using the insulating film 12A as a selective growth mask. The material of the etching end point detection layer 20 is, for example, InGaAsP. The layer thickness of the etching end point detection layer 20 is, for example, 40 nm.

Figure 5:
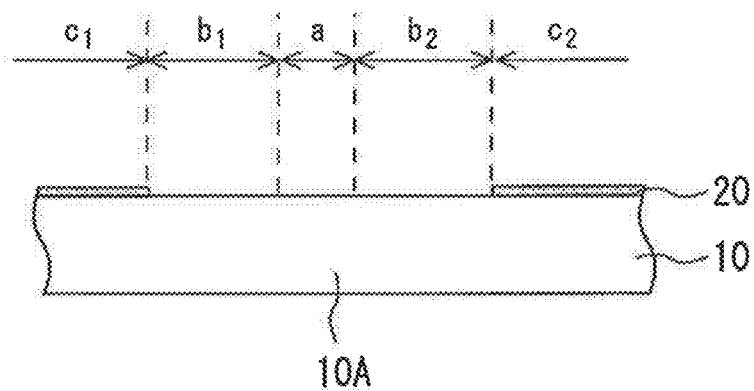
FIG. 5 shows an etching end point detection layer.

Next, as shown in FIG. 5 which is a cross-sectional view, the insulating film 12A is removed while leaving the etching end point detection layer 20. The insulating film 12A is removed by wet etching using, for example, a fluorinated acid-based chemical solution. Thus, the etching end point detection layer 20 having an opening is formed. Of the substrate 10, the portion exposed by the opening of the etching end point detection layer 20 is called an exposed portion 10A.

Since the steps so far are steps for forming the etching end point detection layer 20, these steps are collectively called a detection layer formation step. The detection layer formation step can be summarized as removing the insulating film 12 so as to leave the insulating film 12A on the exposed portion 10A, forming the etching end point detection layer 20 in the region from which the insulating film 12 has been removed, and removing the insulating film 12A on the exposed portion 10A while leaving the etching end point detection layer 20.

Figure 6:
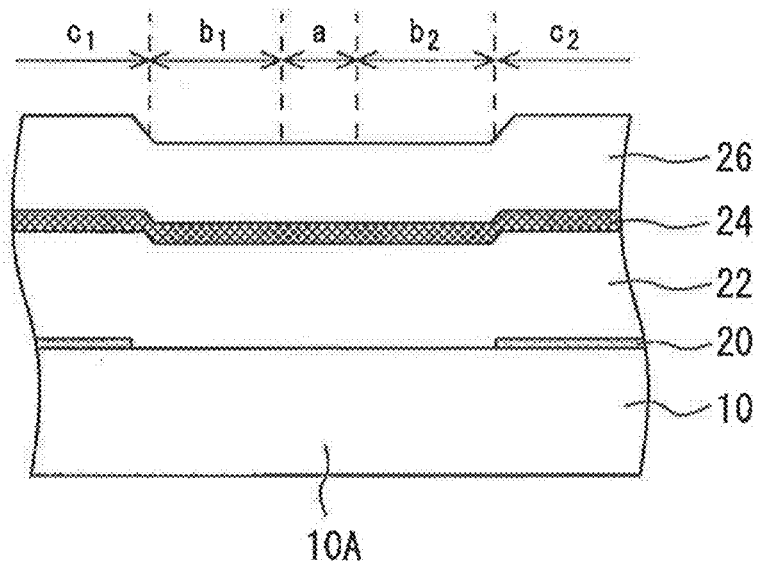
FIG. 6 shows a lower clad layer, an active layer and an upper clad layer.

After the detection layer formation step, as shown in FIG. 6 which is a cross-sectional view, a lower clad layer 22, an active layer 24 and an upper clad layer 26 are made to epitaxially grow on the exposed portion 10A and the etching end point detection layer 20. In this way, the etching end point detection layer 20 is embedded with the lower clad layer 22, the active layer 24 and the upper clad layer 26. The material of the lower clad layer 22, the active layer 24 and the upper clad layer 26 is, for example, p-type InP, InGaAsP or n-type InP when p-type InP is used for the substrate.

Figure 7:
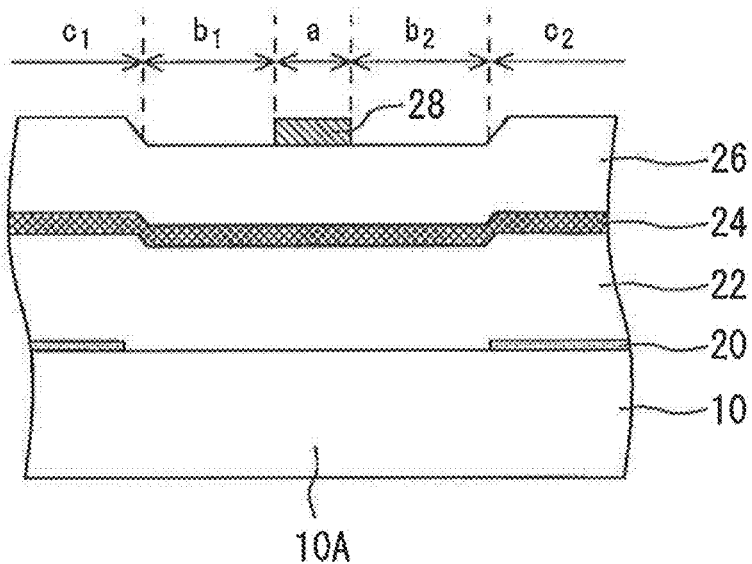
FIG. 7 shows an insulating film pattern.

Next, as shown in FIG. 7 which is a cross-sectional view, an insulating film pattern 28 is formed. The insulating film pattern 28 is formed directly on the ridge formation region a of the upper clad layer 26 formed above the exposed portion 10A. In other words, the insulating film pattern 28 is formed at a distance corresponding to the clearance region b1 or b2 from directly above the boundary between the exposed portion 10A and the etching end point detection layer 20. The insulating film pattern 28 is, for example, $SiO_2$ having a film thickness of 400 nm formed using a plasma-CVD method.

Figure 8:
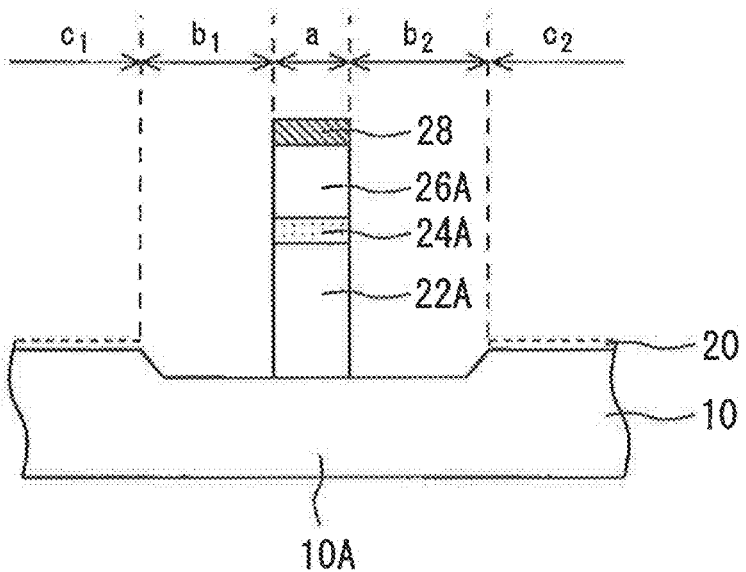
FIG. 8 shows an etching step.

Next, the process moves to an etching step. In the etching step, as shown in FIG. 8 which is a cross-sectional view, the upper clad layer 26, the active layer 24 and the lower clad layer 22 are etched using the insulating film pattern 28 as a mask. This etching is performed through ICP-RIE (Inductive Coupled Plasma-RIE) using, for example, a $SiCl_4$/Ar mixed gas.

Etching is stopped at a point in time at which the etching end point detection layer 20 is exposed from the surface or after a lapse of a predetermined time from that point in time. The exposure of the etching end point detection layer 20 from the surface is detected by monitoring plasma light emission intensity of at least one of constituent elements of the etching end point detection layer 20.

That is, when the etching progresses close to the top surface of the etching end point detection layer 20, the plasma light emission intensity caused by InGaAsP which is the material of the etching end point detection layer 20 changes. The point in time at which this amount of change reaches a predetermined threshold is assumed to be a "point in time at which the etching end point detection layer 20 is exposed from the surface." For example, if the plasma light emission intensity of In is monitored, when the etching progresses close to the top surface of the etching end point detection layer 20, the plasma light emission intensity decreases. This point in time at which the amount of decrease (amount of change) reaches a predetermined threshold is assumed to be a "point in time at which the etching end point detection layer 20 is exposed from the surface." Note that to improve the detection accuracy of the point in time at which the etching end point detection layer 20 is exposed from the surface, it is preferable to monitor plasma light emission intensity of a plurality of elements such as In and P.

In the first embodiment, etching is stopped at the point in time at which the etching end point detection layer 20 is removed. When the etching step ends, a stripe-shaped ridge provided with the lower clad layer 22A, the active layer 24A and the upper clad layer 26A is formed in the ridge formation region a.

Figure 9:
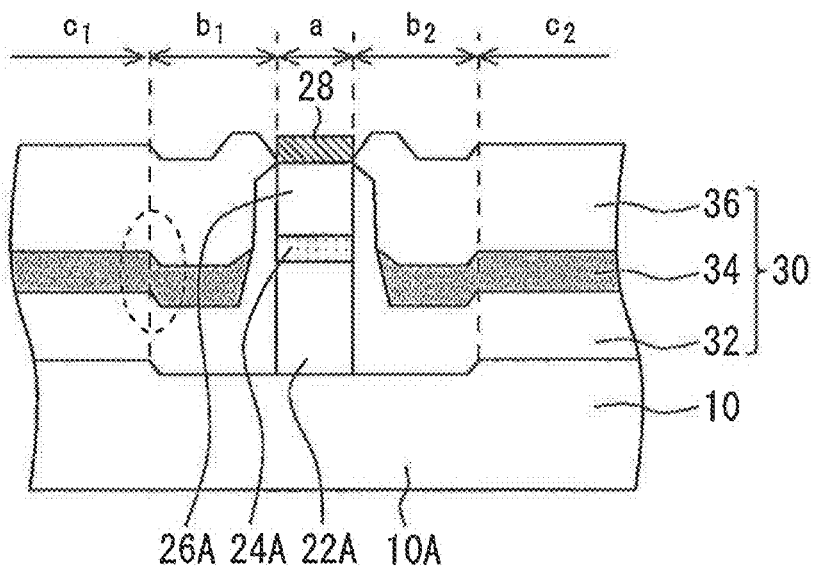
FIG. 9 shows a current block layer.

Next, as shown in FIG. 9 which is a cross-sectional view, a current block layer 30 is formed. The current block layer 30 is formed by means of epitaxial growth using the insulating film pattern 28 as a selective growth mask. The current block layer 30 is not particularly limited, but it is provided with a p-type InP layer 32, an n-type InP layer 34 and a p-type InP layer 36 when, for example, p-type InP is used for the substrate 10. In the current block layer 30, the ridge formed below the insulating film pattern 28 in the etching step is embedded.

Figure 10:
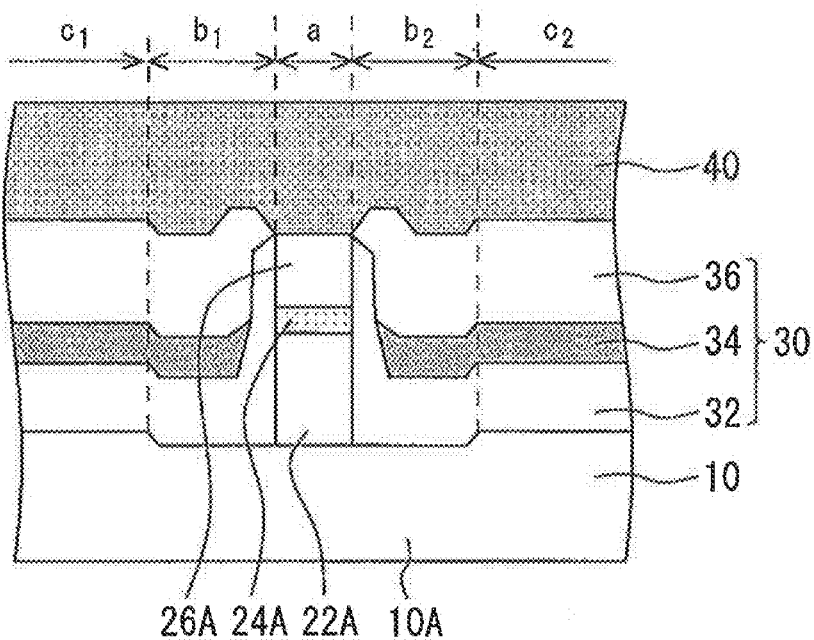
FIG. 10 shows a contact layer.

Next, the insulating film pattern 28 is removed by wet etching using, for example, a fluorinated acid-based chemical solution. Next, as shown in FIG. 10 which is a cross-sectional view, a contact layer 40 is made to epitaxially grow. This completes an embedded type semiconductor laser element in which a ridge is embedded.

When ridge etching is performed using the active layer or diffraction grating layer as an etching end point detection layer, it is necessary to first detect that the etching end point detection layer is exposed from the surface and then perform over etching and remove the lower clad layer or the like. In this case, since the amount of over etching is large, the etching depth is not stable.

In the first embodiment of the present invention, the etching end point detection layer 20 is located below the lower clad layer 22, the active layer 24 and the upper clad layer 26 which are to be etched in the etching step. Therefore, the amount of over etching after the point in time at which the etching end point detection layer 20 is exposed from the surface is 0 or a small value. That is, the point in time at which the etching end point detection layer 20 is exposed from the surface is equal to or substantially equal to the end point of etching This makes it possible to obtain a stable etching depth, and thereby stabilize ridge etching.

Next, meanings of the clearance regions b1 and b2 will be described. When the etching end point detection layer is formed, a crystal defect may be introduced into the substrate. This crystal defect causes surface morphology to deteriorate, resulting in an insufficient formation of the current block layer and leading to a leakage current (first problem). Moreover, when a height difference in the current block layer (see the broken line circle in FIG. 9) comes too close to the ridge, this may also result in an insufficient formation of the current block layer (second problem). In the method for manufacturing a semiconductor laser element according to the first embodiment of the present invention, the clearance regions b1 and b2 are provided between the outside regions c1 and c2 in which the etching end point detection layer 20 is formed and the ridge formation region a in which the ridge is formed.

Thus, even if the above-described crystal defect is found, the portion of the current block layer 30 abutting the ridge can be formed sufficiently, and the first problem can be thereby solved. Moreover, since the height difference in the current block layer can be separated from the ridge, the second problem can be solved. Thus, the clearance regions b1 and b2 are provided to prevent use of the etching end point detection layer 20 from adversely affecting characteristics of the semiconductor laser element.

To prevent the above-described crystal defect from occurring, the method for manufacturing a semiconductor laser element according to the first embodiment of the present invention forms the etching end point detection layer 20 by means of epitaxial growth so as to achieve lattice matching with the substrate 10. The provision of the clearance regions b1 and b2 can control the first problem to a certain degree, therefore it is not always necessary to cause the etching end point detection layer 20 to achieve lattice matching with the substrate 10.

In the etching step according to the first embodiment of the present invention, the "point in time at which the etching end point detection layer 20 is exposed from the surface" is detected by monitoring the plasma light emission intensity, but such detection may be achieved using other methods. For example, light may be radiated onto the etching end point detection layer 20 to monitor a reflected interference waveform and the point in time at which the etching end point detection layer 20 is exposed from the surface may be detected from the interference waveform.

The material of the etching end point detection layer is not particularly limited as long as it is a material different from that of the substrate. However, to monitor the plasma light emission intensity of the constituent elements of the etching end point detection layer 20, the etching end point detection layer is preferably formed of a material containing at least one of Al, Ga and As.

The widths of the clearance regions b1 and b2 are not limited to 1 μm as long as the above-described first and second problems can be solved. The widths of the clearance regions b1 and b2 are preferably set to 1 μm or more to reliably control the first and second problems.

In addition to the above-described modifications, the method for manufacturing a semiconductor laser element according to the first embodiment of the present invention can be modified in various ways. For example, the substrate 10 is not limited to InP. Furthermore, a diffraction grating layer may be included in an upper part or lower part of the active layer. Furthermore, in the first embodiment, as shown in FIG. 5, the etching end point detection layers 20 are formed to the left and right of the exposed portion 10A, but the etching end point detection layer 20 may be formed only on one side of the exposed portion 10A. These modifications are also applicable to methods for manufacturing a semiconductor laser element according to the following embodiments.

The methods for manufacturing a semiconductor laser element according to the following embodiments have many points in common with the method for manufacturing a semiconductor laser element according to the first embodiment, and so the description of these methods will focus on differences from the first embodiment.

Second Embodiment.

Figure 11:
FIG. 11 shows an etching end point detection layer.
Figure 12:
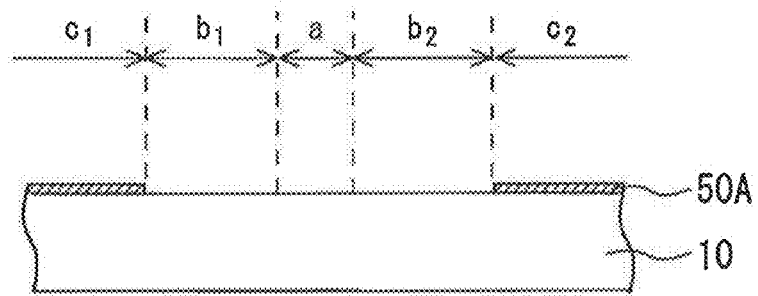
FIG. 12 shows an etching end point detection layer.

A detection layer formation step according to a second embodiment of the present invention will be described with reference to FIGS. 11 and 12. First, as shown in FIG. 11 which is a cross-sectional view, an etching end point detection layer 50 is formed on the entire surface of the substrate 10 by epitaxial growth. Next, as shown in FIG. 12 which is a cross-sectional view, the etching end point detection layer 50 on the exposed portion 10A is removed, for example, by wet etching with a tartaric acid-based chemical solution or phosphoric acid-based chemical solution using a resist mask. An etching end point detection layer 50A having an opening can thereby be obtained.

The detection layer formation step is not particularly limited as long as an etching end point detection layer having an opening is formed on the substrate using a material different from that of the substrate, and therefore the etching end point detection layer may be formed in steps different from those described above.

Third Embodiment.

Figure 13:
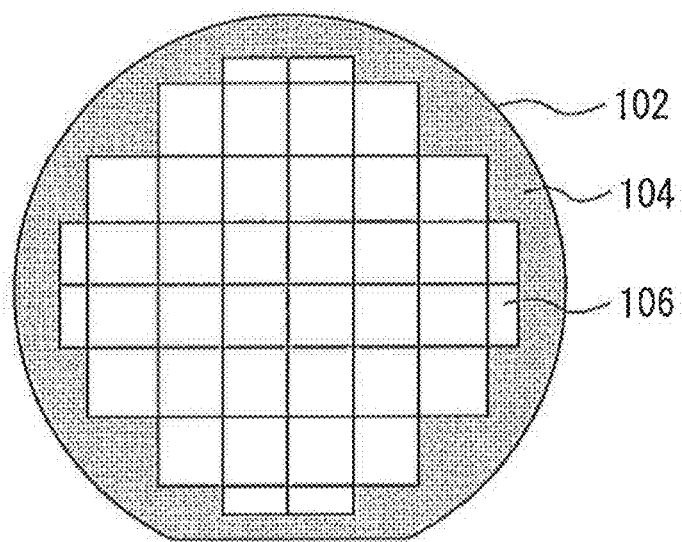
FIG. 13 is a plan view of substrate after a detection layer formation step according to the third embodiment.

A method for manufacturing a semiconductor laser element according to a third embodiment of the present invention has a feature that an etching end point detection layer is formed in a non-effective region on the perimeter of a wafer. FIG. 13 is a plan view of a substrate 102 after a detection layer formation step according to the third embodiment of the present invention. The substrate 102 is a wafer formed of, for example, InP.

In the detection layer formation step, an etching end point detection layer 104 is formed in a non-effective region outside the effective region of the wafer (substrate 102) in which a semiconductor laser element is formed. An exposed portion 106 of the substrate 102 in which no etching end point detection layer 104 is formed and from which the substrate 102 is exposed is also an effective region.

Figure 14:
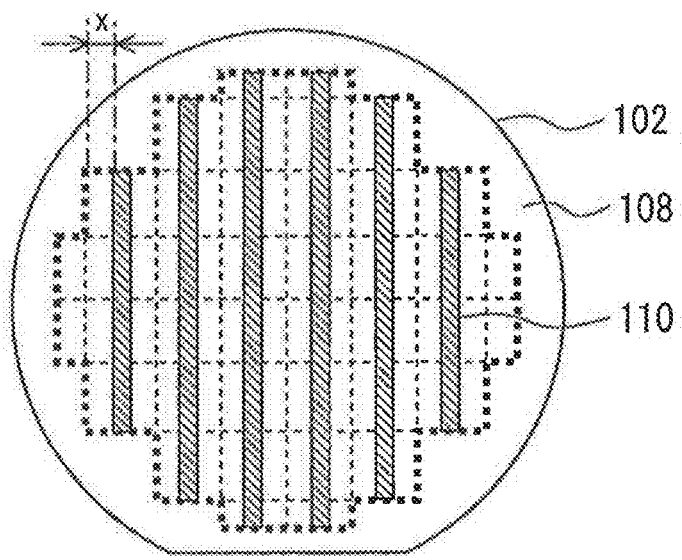
FIG. 14 is a plan view of the substrate illustrating that an insulating film pattern is formed.

Next, a lower clad layer, an active layer and an upper clad layer are formed on the etching end point detection layer 104 and the exposed portion 106. Next, an insulating film pattern is formed. FIG. 14 is a plan view of the substrate 102 illustrating that an insulating film pattern is formed. The effective region is shown by a broken line. An insulating film pattern 110 is formed on the upper clad layer 108 formed on the entire surface of the substrate 102. A ridge formation region is located directly below the portion in which the insulating film pattern 110 is formed.

The insulating film pattern 110 is formed at a distance corresponding to the clearance region from directly above a boundary (portion shown by a thick broken line) between the exposed portion and the etching end point detection layer. 1 μm or more is secured for a width x of the clearance region. Subsequent steps are the same as those in the first embodiment.

The method for manufacturing a semiconductor laser element according to the third embodiment of the present invention forms the etching end point detection layer 104 in the non-effective region, and can thereby expand the clearance region compared to the case where the etching end point detection layer is formed in a chip. It is thereby possible to reliably solve the first and second problems.

Figure 15:
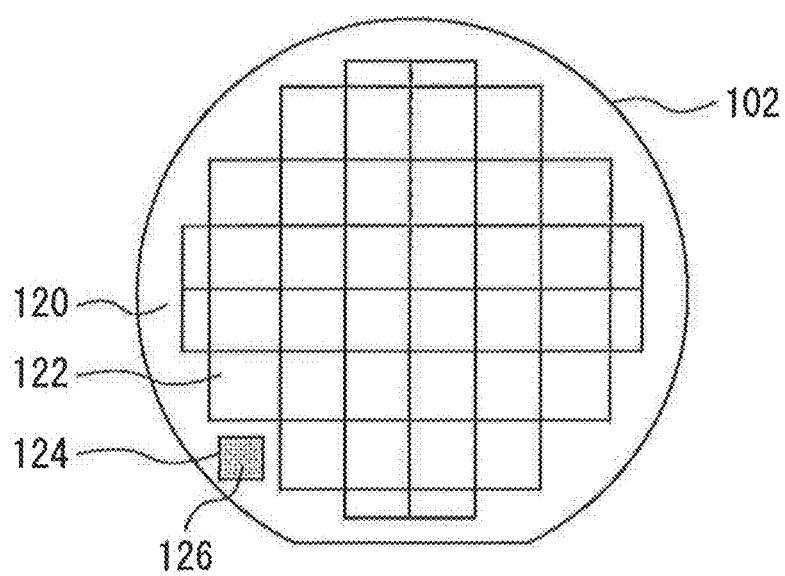
FIG. 15 is a plan view of the substrate after the detection layer formation step.

FIG. 15 is a plan view illustrating a modification of the method for manufacturing a semiconductor laser element according to the third embodiment of the present invention. FIG. 15 is a plan view of the substrate 102 after the detection layer formation step. The substrate 102 is divided into a non-effective region 120 and an effective region 122. A TEG region 124 is formed in the non-effective region 120. In the detection layer formation step, an etching end point detection layer 126 is formed in the TEG region 124. Thus, even when the etching end point detection layer 126 is formed in the TEG region 124, it is possible to expand the clearance region.

According to the present invention, since the etching end point detection layer is formed at a place apart from the region in which the ridge is formed below the etched layer, stable ridge etching can be performed without adversely affecting characteristics of the semiconductor laser element.

Obviously many modifications and variations of the present invention are possible in the light of the above teachings. It is therefore to be understood that within the scope of the appended claims the invention may be practiced otherwise than as specifically described.

What is claimed is:

1. A method for manufacturing a semiconductor laser element, comprising:
   forming an etching end point detection layer on a part of a substrate using a material different from a material of the substrate;
   forming an exposed portion of the substrate and forming a lower cladding layer, an active layer and an upper cladding layer on the etching end point detection layer and on the exposed portion of the substrate;

forming an insulating film pattern on the upper cladding layer above the exposed portion, at a distance corresponding to a clearance region, from directly above a boundary between the exposed portion and the etching end point detection layer;

etching the upper clad layer, the active layer, and the lower cladding layer using the insulating film pattern as a mask and stopping etching at a time when the etching end point detection layer is exposed by the etching or after a predetermined time duration after the time; and embedding in a current block layer a ridge formed below the insulating film pattern in the etching step.

2. The method for manufacturing a semiconductor laser element according to claim 1, wherein, in the etching, the exposure of the etching end point detection layer by the etching is detected by monitoring plasma light emission intensity of at least one constituent element of the etching end point detection layer.

3. The method for manufacturing a semiconductor laser element according to claim 1, wherein, in the etching, the exposure of the etching end point detection layer by the etching is detected by radiating light onto the etching end point detection layer and monitoring a reflected interference waveform.

4. The method for manufacturing a semiconductor laser element according to claim 1, wherein
the etching end point detection layer includes at least one of Al, Ga and As, and
the substrate and the etching end point detection layer are lattice matched.

5. The method for manufacturing a semiconductor laser element according to claim 1, wherein width of the clearance region is at least 1 μm.

6. The method for manufacturing a semiconductor laser element according to claim 1, wherein forming of the etching end point detection layer comprises:
forming an insulating film on an entire surface of the substrate;
removing the insulating film in a region to leave a portion of the insulating film on the exposed portion;
forming the etching end point detection layer in the region where the insulating film has been removed; and
removing the insulating film on the exposed portion, leaving the etching end point detection layer.

7. The method for manufacturing a semiconductor laser element according to claim 1, wherein forming of the etching point detection layer comprises:
forming the etching end point detection layer on an entire surface of the substrate; and
removing the etching end point detection layer on the exposed portion.

8. The method for manufacturing a semiconductor laser element according to claim 1, wherein, in forming of the etching end point detection layer, forming the etching end point detection layer in a non-effective region outside an effective region of the wafer where the semiconductor laser element is formed.

* * * * *